(12) United States Patent
Chen et al.

(10) Patent No.: US 12,424,753 B2
(45) Date of Patent: Sep. 23, 2025

(54) ANTENNA AND ELECTRONIC DEVICE

(71) Applicants: Beijing BOE Sensor Technology Co., Ltd., Beijing (CN); BOE Technology Group Co., Ltd., Beijing (CN)

(72) Inventors: Zhe Chen, Beijing (CN); Yunnan Jin, Beijing (CN); Zhifeng Zhang, Beijing (CN); Guohui Nan, Beijing (CN); Chunnan Feng, Beijing (CN); Sihui Bao, Beijing (CN); Shuo Yang, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/021,914

(22) PCT Filed: Apr. 29, 2022

(86) PCT No.: PCT/CN2022/090118
§ 371 (c)(1),
(2) Date: Feb. 17, 2023

(87) PCT Pub. No.: WO2023/206314
PCT Pub. Date: Nov. 2, 2023

(65) Prior Publication Data
US 2024/0275053 A1 Aug. 15, 2024

(51) Int. Cl.
*H01Q 9/04* (2006.01)
*H01Q 13/10* (2006.01)
(Continued)

(52) U.S. Cl.
CPC ......... *H01Q 9/0414* (2013.01); *H01Q 13/106* (2013.01); *H01Q 21/08* (2013.01);
(Continued)

(58) Field of Classification Search
CPC .. H01Q 21/064; H01Q 13/106; H01Q 9/0428; H01Q 9/0435; H01Q 1/521;
(Continued)

(56) References Cited

U.S. PATENT DOCUMENTS

2008/0074337 A1* 3/2008 Manholm ............ H01Q 13/106
343/769
2013/0187830 A1 7/2013 Warnick et al.
(Continued)

FOREIGN PATENT DOCUMENTS

| CN | 109860990 A | 6/2019 |
| CN | 113497353 A | 10/2021 |

(Continued)

OTHER PUBLICATIONS

Ding, Chen et al. "An optically transparent dual-polarized stacked patch antenna with metal-mesh films", IEEE Antennas & Wireless Propagation Letters, vol. 18, No. 10, pp. 1981-1985. (Year: 2019).*

*Primary Examiner* — Dimary S Lopez Cruz
*Assistant Examiner* — Anna N Hamadyk
(74) *Attorney, Agent, or Firm* — Nath, Goldberg & Meyer; Joshua B. Goldberg (57) ABSTRACT

An antenna and an electronic device are provided and belong to communication technology. The antenna includes an antenna substrate and a flexible circuit board. The antenna substrate includes: a first dielectric substrate, a first conductive layer on the first dielectric substrate and including at least one first feed line and at least one second feed line; a second conductive layer on a side of the first dielectric substrate away from the first conductive layer and including at least one first opening. The flexible circuit board includes: a second dielectric substrate and a third dielectric substrate opposite to each other; a third conductive layer between the second dielectric substrate and the third dielectric substrate; a first feed structure on a side of the second dielectric (Continued)

substrate away from the third conductive layer; each second feed port of the first feed structure being electrically connected to a corresponding first feed line.

18 Claims, 7 Drawing Sheets

(51) Int. Cl.
    *H01Q 21/08*     (2006.01)
    *H01Q 21/24*     (2006.01)
    *H05K 1/02*     (2006.01)

(52) U.S. Cl.
    CPC ........... *H01Q 21/24* (2013.01); *H05K 1/0298* (2013.01); *H05K 2201/0145* (2013.01)

(58) Field of Classification Search
    CPC .......... H01Q 1/38; H01Q 21/08; H01Q 21/24; H01Q 9/045; H01Q 9/0414; H05K 1/189; H05K 1/0298; H05K 2201/0145
    See application file for complete search history.

(56) References Cited

U.S. PATENT DOCUMENTS

| | | | | |
|---|---|---|---|---|
| 2019/0379135 | A1* | 12/2019 | Sharawi | H01Q 21/064 |
| 2022/0271412 | A1* | 8/2022 | Choi | H01Q 21/24 |
| 2023/0027303 | A1* | 1/2023 | Choi | H01Q 1/243 |

FOREIGN PATENT DOCUMENTS

| | | |
|---|---|---|
| CN | 215418600 U | 1/2022 |
| WO | 2021233251 A1 | 11/2021 |

\* cited by examiner

ANTENNA AND ELECTRONIC DEVICE

This is a National Phase Application filed under 35 U.S.C. 371 as a national stage of PCT/CN2022/090118, filed Apr. 29, 2022, the contents of which are hereby incorporated by reference in its entirety.

TECHNICAL FIELD

The present disclosure relates to the field of communication technology, and in particular to an antenna and an electronic device.

BACKGROUND

With the continuous development of mobile communication technology, an antenna is indispensable in a mobile communication device, and people require higher electrical performance of the antenna and have increasing requirements for the aesthetics of the antenna as a product. In addition, nowadays, in the 5G era, the number of communication base stations will come into people's lives in multiples in the future. However, a huge number of communication base stations coming into people's lives will certainly make people worry about the electromagnetic radiation. A transparent base station antenna with excellent concealment can solve this problem.

SUMMARY

The present disclosure is directed to at least one of the technical problems of the prior art, and provides an antenna and an electronic device.

In a first aspect, the embodiment of the present disclosure provides an antenna, including an antenna substrate and a flexible circuit board; the antenna substrate includes: a first dielectric substrate; a first conductive layer on the first dielectric substrate and including at least one first feed line and at least one second feed line; and a second conductive layer on a side of the first dielectric substrate away from the first conductive layer and including at least one first opening; an outline of an orthographic projection of one of the at least one first opening on the first dielectric substrate intersects with an outline of an orthographic projection of one of the at least one first feed line on the first dielectric substrate and an outline of an orthographic projection of one of the at least one second feed line on the first dielectric substrate; and the orthographic projection of the first feed line on the first dielectric substrate and the orthographic projection of the second feed line on the first dielectric substrate extends into the orthographic projection of the first opening on the first dielectric substrate; and the first feed line and the second feed line have different feed directions; and the flexible circuit board includes: a second dielectric substrate and a third dielectric substrate opposite to each other; a third conductive layer between the second dielectric substrate and the third dielectric substrate; a first feed structure on a side of the second dielectric substrate away from the third conductive layer; each second feed port of the first feed structure is electrically connected to a corresponding first feed line; and a second feed structure on a side of the third dielectric substrate away from the third conductive layer; each fourth feed port of the second feed structure is electrically connected to a corresponding second feed line.

In an embodiment, the flexible circuit board includes: a fourth conductive layer on a side of the second dielectric substrate away from the third conductive layer and including the first feed structure, at least one first connection pad, at least one second connection pad, and at least one third connection pad; each second feed port of the first feed structure is electrically connected to a corresponding first connection pad, and each first feed line is bound to a corresponding first connection pad; the third conductive layer is electrically connected to the at least one third connection pad through first connection vias penetrating through the second dielectric substrate; the second conductive layer is electrically connected to the at least one third connection pad; and a fifth conductive layer on a side of the third dielectric substrate away from the third conductive layer and including the second feed structure; each fourth feed port of the second feed structure is electrically connected to a corresponding second connection pad through a corresponding second connection via penetrating through the second dielectric substrate and the third dielectric substrate, and each second feed line is bound to a corresponding second connection pad.

In an embodiment, the antenna substrate includes at least one radiation unit, each of which includes one first opening, and one first feed line and one second feed line; an outline of an orthographic projection of each of the first feed line and the second feed line on the first dielectric substrate intersects with an outline of an orthographic projection of the first opening on the first dielectric substrate; each radiation unit further includes a first isolation component in the first conductive layer and between the first feed line and the second feed line and bound to the at least one third connection pad; and in each radiation unit, an orthographic projection of the first isolation component on the first dielectric substrate intersects with the outline of the orthographic projection of the first opening on the first dielectric substrate and extends into the orthographic projection of the first opening on the first dielectric substrate.

In an embodiment, at least one side wiring is disposed on a side of the first dielectric substrate; and each first isolation component is electrically connected to the second conductive layer through a corresponding side wiring.

In an embodiment, each first isolation component has a length in a range from 0.2λc to 0.25 λc, where λc is a wavelength at a center frequency.

In an embodiment, the at least one first opening includes a plurality of first openings arranged side by side along a first direction; the second conductive layer includes a first side edge and a second side edge opposite to each other in a second direction; the flexible circuit board is closer to the first side edge than the second side edge; and the second conductive layer further includes second openings penetrating through the first side edge, at least one second opening is disposed between any two adjacent first openings, and an extending direction of each second opening intersects with the first direction.

In an embodiment, each second opening extends in the second direction and has a length in a range from 0.2λc to 0.25 λc, where λc is a wavelength at a center frequency.

In an embodiment, the second conductive layer further includes third openings penetrating through the second side edge, and at least one third opening is disposed between any two adjacent first openings, and an extending direction of each third opening intersects with the first direction; each second opening and a corresponding third opening are in mirror symmetry with respect to a line connecting centers of the plurality of first openings as a symmetry axis.

In an embodiment, the second conductive layer includes a metal mesh structure.

In an embodiment, the antenna substrate further includes a plurality of first connection strips in the same layer as the second conductive layer; and the plurality of first connection strips short connects an edge of the metal mesh structure close to the flexible circuit board.

In an embodiment, an outline of each first opening includes a polygon.

In an embodiment, the polygon includes a first side, a second side, a third side, a fourth side, a fifth side, a sixth side, a seventh side, and an eighth side connected in sequence; an extending direction of the first side is the same as that of the fifth side, and is perpendicular to that of the third side; and an orthographic projection of a corresponding first feed line on the first dielectric substrate intersect with an orthographic projection of the second side on the first dielectric substrate and an orthographic projection of a corresponding second feed line on the first dielectric substrate intersect with an orthographic projection of the eighth side on the first dielectric substrate.

In an embodiment, the at least one first opening includes $2^n$ first openings; the first feed structure includes n stages of third feed lines, and the second feed structure includes n stages of fourth feed lines; one third feed line at the 1st stage is connected to two adjacent first feed lines, and different third feed lines at the 1st stage are connected to different two adjacent first feed lines; one third feed line at the m-th stage is connected to two adjacent third feed lines at the (m−1)-th stage, and different third feed lines at the m-th stage are connected to different two adjacent third feed lines at the (m−1)-th stage; one fourth feed line at the 1st stage is connected to two adjacent second feed lines, and different fourth feed lines at the 1st stage are connected to different two adjacent second feed lines; one fourth feed line at the m-th stage is connected to two adjacent fourth feed lines at the (m−1)-th stage, and different fourth feed lines at the m-th stage are connected to different two adjacent fourth feed lines at the (m−1)-th stage; where n≥2, 2≤m≤n; and both m and n are integers; and at least one of the third feed lines and the fourth feed lines is a micro-strip line.

In an embodiment, each of the third feed lines and the fourth feed lines has two feed ports; a feed port of the third feed line at the 1st stage is a second feed port of the first feed structure; a feed port of the fourth feed line at the 1st stage is a fourth feed port of the second feed structure; the first feed port of the first feed structure is connected to the third feed line at the n-th stage; the third feed port of the second feed structure is connected to the fourth feed line at the n-th stage; and the antenna further includes a first connector and a second connector; the first connector is electrically connected to the first feed port of the first feed structure; and the second connector is electrically connected to the third feed port of the second feed structure.

In an embodiment, the fourth conductive layer further includes a first patch electrode on two sides of the first feed port of the first feed structure in an extending direction of the first feed port; the first patch electrode is electrically connected to the third conductive layer through third connection vias penetrating through the second dielectric substrate; and the fifth conductive layer further includes a second patch electrode on two sides of the third feed port of the first feed structure in an extending direction of the third feed port; and the second patch electrode is electrically connected to the third conductive layer through fourth connection vias penetrating through the third dielectric substrate.

In an embodiment, the first dielectric substrate includes a first dielectric sub-layer, a first adhesive layer, a support layer, a second adhesive layer, a second dielectric sub-layer, which are stacked; the first conductive layer is on a side of the first dielectric sub-layer away from the first adhesive layer; and the second conductive layer is on a surface of the second dielectric sub-layer away from the second adhesive layer.

In an embodiment, a material of the support layer includes any one of polycarbonate, copolymers of cycloolefin, polymethyl methacrylate.

In an embodiment, a material of the first dielectric sub-layer and/or the second dielectric sub-layer includes polyimide or polyethylene terephthalate.

In a second aspect, the embodiment of the present disclosure provides an electronic device, including the antenna of any one of the above embodiments.

DETAIL DESCRIPTION OF EMBODIMENTS

In order to enable one of ordinary skill in the art to better understand the technical solutions of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, quantity, or importance, but rather are used for distinguishing one element from another. Further, the term "a", "an", "the", or the like used herein does not denote a limitation of quantity, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

Figure 1:
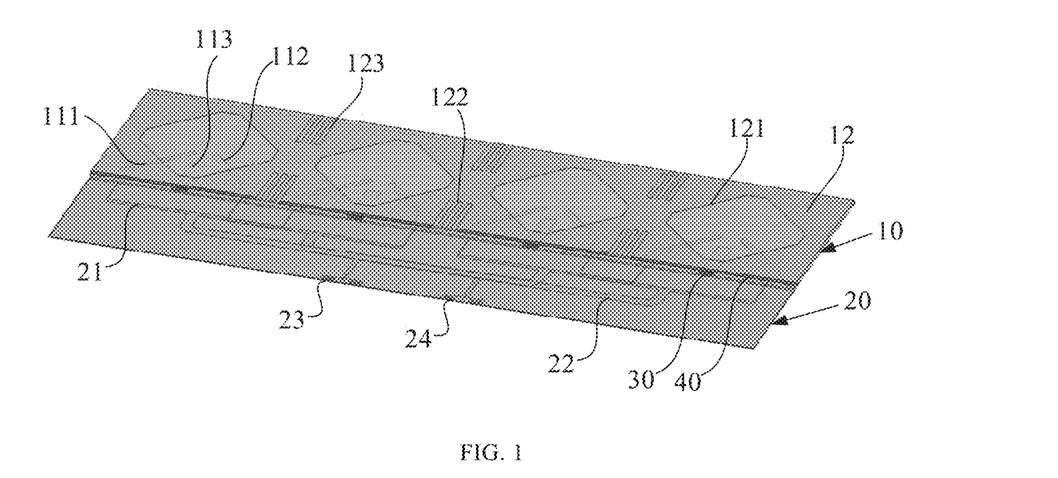
FIG. 1 is a schematic diagram of a structure of an antenna according to an embodiment of the present disclosure.

In a first aspect. FIG. 1 is a schematic diagram of a structure of an antenna according to an embodiment of the present disclosure. As shown in FIG. 1, an embodiment of the present disclosure provides an antenna including an antenna substrate and a flexible circuit board 20. The flexible circuit board 20 is electrically connected to the antenna substrate 10 for providing microwave signals to the antenna substrate 10.

Figure 2:
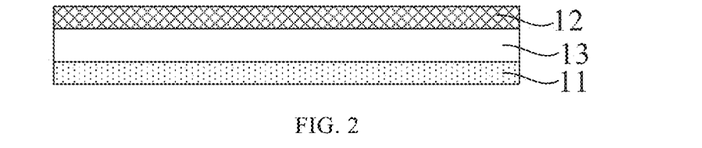
FIG. 2 is a cross-sectional view of an antenna substrate according to an embodiment of the present disclosure.
Figure 3:
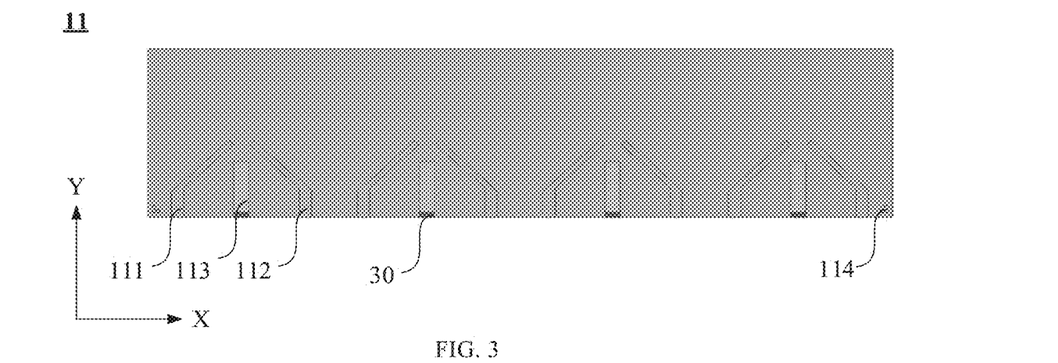
FIG. 3 is a top view of a first conductive layer according to an embodiment of the present disclosure.
Figure 4:
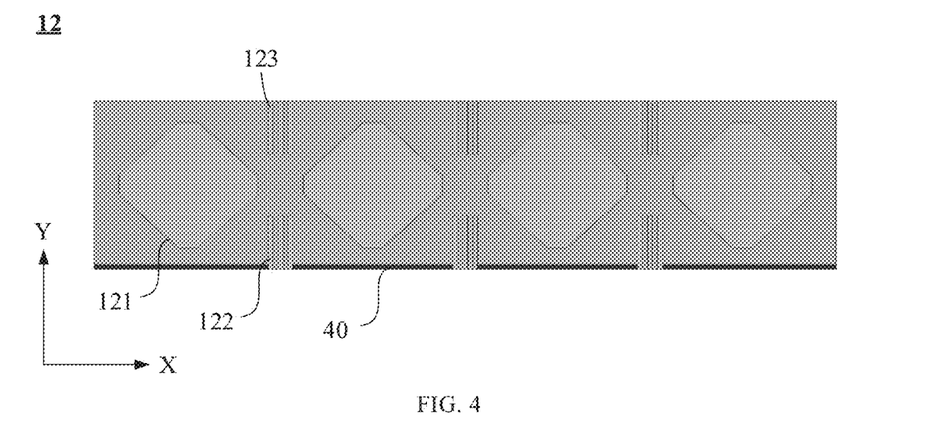
FIG. 4 is a top view of a second conductive layer according to an embodiment of the present disclosure.
Figure 5:
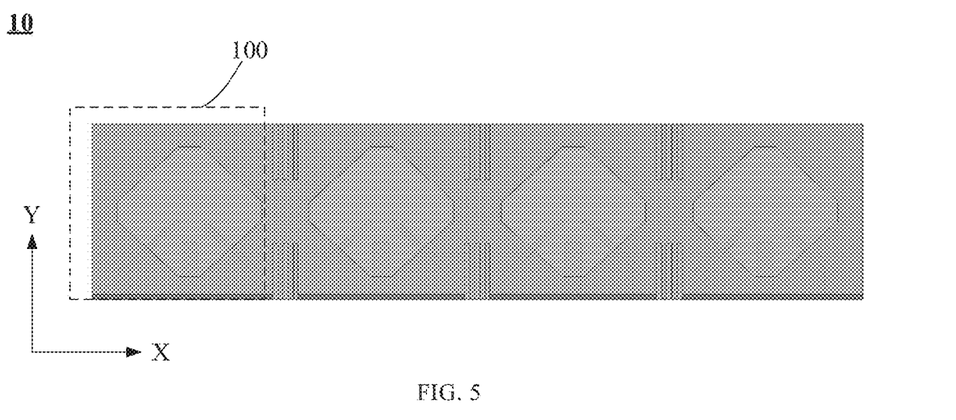
FIG. 5 is a top view of an antenna substrate according to an embodiment of the present disclosure.

Specifically. FIG. 2 is a cross-sectional view of an antenna substrate 10 according to an embodiment of the present disclosure. FIG. 3 is a top view of a first conductive layer 11 according to an embodiment of the present disclosure. FIG. 4 is a top view of a second conductive layer 12 according to an embodiment of the present disclosure. FIG. 5 is a top view of an antenna substrate 10 according to an embodiment of the present disclosure. As shown in FIGS. 2 to 5, the antenna substrate 10 includes: a first dielectric substrate 13, a first conductive layer 11 and a second conductive layer 12. The first conductive layer 11 and the second conductive layer 12 are respectively provided on both surfaces of the first dielectric substrate 13 in a thickness direction of the first dielectric substrate 13. The first conductive layer 11 includes at least one first feed line 111 and at least one second feed line 112. The second conductive layer 12 includes at least one first opening 121.

In some examples, the numbers of the first openings 121, the first feed lines 111, and the second feed lines 112 may be equal to each other, and the first openings 121, the first feed lines 111, and the second feed lines 112 correspond to each other. For orthographic projections of the first openings 121, the first feed lines 111, and the second feed lines 112 corresponding to each other on the first dielectric substrate 13, orthographic projections of a first feed line 111 and a corresponding second feed line 112 on the first dielectric substrate 13 intersect with an orthographic projection of a corresponding first opening 121 on the first dielectric substrate 13; the first feed line 111 and the second feed line 112 have different feed directions. That is, a line, connecting an intersection point of the orthographic projection of a first feed line 111 on the first dielectric substrate 13 and the orthographic projection of a corresponding first opening 121 on the first dielectric substrate 13 with a center of the orthographic projection of the first opening 121 on the first dielectric substrate 13, is a first line segment; a line, connecting an intersection point of the orthographic projection of a second feed line 112 on the first dielectric substrate 13 and the orthographic projection of a corresponding first opening 121 on the first dielectric substrate 13 with the center of the orthographic projection of the first opening 121 on the first dielectric substrate 13, is a second line segment; extending directions of the first line segment and the second line segment intersect with each other. For example: extending directions of the first line segment and the second line segment are perpendicular to each other. A polarization direction of ±45° or 0°/90° of the antenna can be achieved by feeding through the first feed lines 111 and the second feed lines 112. In FIG. 1, as an example, the polarization direction of ±45° of the antenna can be realized.

Figure 6:
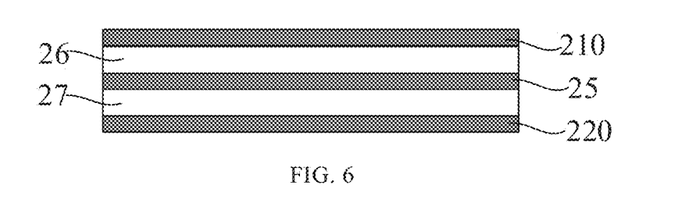
FIG. 6 is a cross-sectional view of a flexible circuit board according to an embodiment of the present disclosure.
Figure 7:
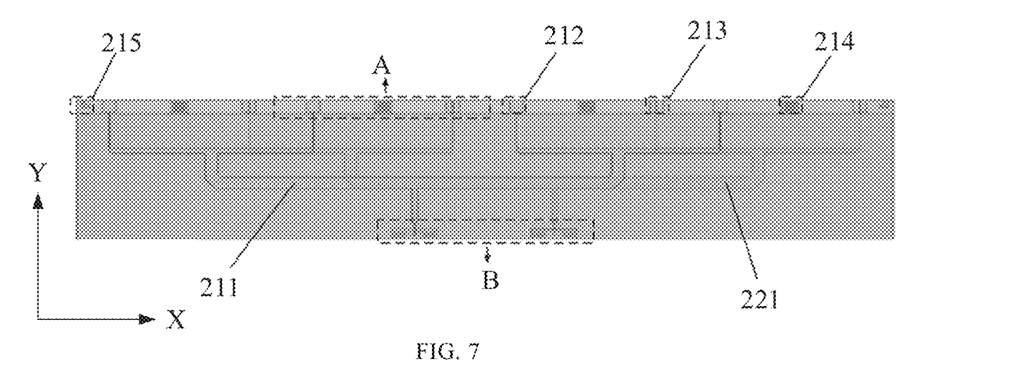
FIG. 7 is a top view of a flexible circuit board according to an embodiment of the present disclosure.

FIG. 6 is a cross-sectional view of a flexible circuit board 20 according to an embodiment of the present disclosure. FIG. 7 is a top view of a flexible circuit board 20 according to an embodiment of the present disclosure. As shown in FIGS. 6 and 7, the flexible circuit board 20 includes a second dielectric substrate 26 and a third dielectric substrate 27 disposed oppositely to each other, and a third conductive layer 25, a fourth conductive layer 210, and a fifth conductive layer 220. The third conductive layer 25 is disposed between the second dielectric substrate 26 and the third dielectric substrate 27, the fourth conductive layer 210 is disposed on a side of the second dielectric substrate 26 away from the third conductive layer 25, and the fifth conductive layer 220 is disposed on a side of the third dielectric substrate 27 away from the third conductive layer 25. The fourth conductive layer 210 includes at least a first feed structure 21, the first feed structure 21 having one first feed port and at least one second feed port. The fifth conductive layer 220 includes at least a second feed structure 22, the second feed structure 22 having one third feed port and at least one fourth feed port. Each second feed port of the first feed structure 21 is electrically connected to one first feed line 111, for implementing a transmission of microwave signals with the first feed line 111 (for transmitting/receiving the microwave signals to/from the first feed line 111). Each fourth feed port of the second feed structure 22 is electrically connected to one second feed line 112, for implementing a transmission of microwave signals with the second feed line 112. In some examples, the number of the second feed ports of the first feed structure 21 is equal to the number of the first feed lines 111, and the second feed ports and the first feed lines are arranged in a one-to-one correspondence. The number of the fourth feed ports of the second feed structure 22 is equal to that of the second feed lines 112, and the fourth feed ports and the second feed lines are arranged in a one-to-one correspondence.

It should be noted that in FIG. 1, as an example, the number of the first openings 121 is $2^n$, the number of the first feed lines 111 is $2^n$, the number of the second feed lines 112 is $2^n$, the number of the second feed ports is $2^n$ and the number of the fourth feed ports is $2^n$, where n≥2, and n is an integer. In the following description, as an example, the number of the first openings 121 is $2^n$, the number of the first feed lines 111 is $2^n$, the number of the second feed lines 112 is $2^n$, the number of the second feed ports is $2^n$ and the number of the fourth feed ports is $2^n$, which should be understood as not limiting the scope of the embodiments of the present disclosure. Each of the number of the first openings 121, the number of the first feed lines 111, the number of the second feed lines 112, the number of the second feed ports and the number of the fourth feed ports may also be 1 or any odd number. The second conductive layer 12 and the third conductive layer 25 in the embodiment of the present disclosure may be ground layers, such that a current loop is formed between the first conductive layer 11 and the second conductive layer 12; a current loop is formed between the third conductive layer 25 and the fourth conductive layer 210; a current loop is formed between the third conductive layer 25 and the fifth conductive layer.

In the antenna according to the embodiment of the present disclosure, the first feed structure 21 and the second feed structure 22 are integrated on the flexible circuit board 20, and are disposed in different layers. At this time, the first feed structure 21 and the second feed structure 22 may be electrically connected (for example, bound) to the antenna substrate 10 on a side of the antenna substrate 10, so as to implement microwave communication between the flexible circuit board 20 and the antenna substrate 10. In this case, a size of the antenna can be effectively reduced, and the miniaturized design of the antenna can be implemented.

Figure 8:
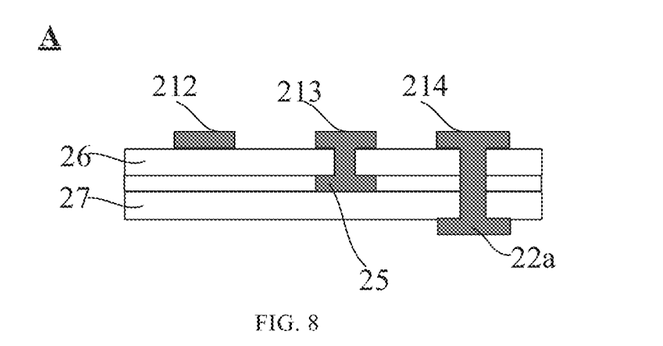
FIG. 8 is a cross-sectional view at a position A in FIG. 7.

In some examples, FIG. 8 is a cross-sectional view at a position A in FIG. 7. Referring to FIGS. 7 and 8, the fourth conductive layer 210 includes not only the first feed structure 21 but also first connection pads 212, second connection pads 213, and third connection pads 214. The second feed ports of the first feed structure 21 in the fourth conductive layer 210 are connected to the first connection pads 212 in a one-to-one correspondence; the fourth feed ports of the second feed structure 22 in the fifth conductive layer 220 are connected to the second connection pads 213 in a one-to-one correspondence through second connection vias penetrating through the second dielectric substrate 26 and the third dielectric substrate 27; the third conductive layer 25 is electrically connected to the third connection pads 214 through a first connection via penetrating through the second dielectric substrate 26, and the second conductive layer 12 is electrically connected to the third connection pads 214. In the embodiment of the present disclosure, the first feed lines 111 on the antenna substrate 10 are in a one-to-one correspondence with the first connection pads 212, and the first feed line 111 and the first connection pad 212 to each other are bound to each other; the second feed lines 112 are in a one-to-one correspondence with the second connection pads 213, and the second feed line 112 and the second connection pad 213 to each other are bound to each other. For example: the first feed line 111 and the first connection pad 212 corresponding to each other are bound to each other by ACF adhesive (a transparent optical conductive adhesive); and the second feed line 112 and the second connection pad 213 corresponding to each other are bound to each other by the ACF adhesive. It should be noted that during the binding, the first conductive layer 11 is provided with an alignment mark 114, and the fourth conductive layer 210 is provided with an alignment mark 215, and the alignment mark 114 and the alignment mark 215 are precisely aligned with each other, so as to achieve the binding of the feed line and the connection pad.

Further, with reference to FIG. 5, the antenna substrate 10 includes at least one radiation unit 100 (in the drawings, 2" radiation units 100 as an example), each radiation unit 100 includes one first opening 121, and one first feed line 111 and one second feed line 112; an outline of an orthographic projection of each of the first feed line 111 and the second feed line 112 on the first dielectric substrate 13 intersects with an outline of an orthographic projection of the first opening 121 on the first dielectric substrate 13. Specifically, each radiation unit 100 according to the embodiment of the present disclosure further includes a first isolation component 113 located in the first conductive layer 11 and between the first feed line 111 and the second feed line 112, and bound to a corresponding third connection pad 214, and an orthographic projection of the first isolation component 113 on the first dielectric substrate 13 intersects with the outline of the orthographic projection of the first opening 121 on the first dielectric substrate 13, and extends into the orthographic projection of the first opening 121 on the first dielectric substrate 13. By providing the first isolation component 113 between the first feed line 111 and the second feed line 112 of the radiation unit 100, and bound to a corresponding third connection pad 214 (that is, the first isolation component is grounded), the coupling between the feed ports of the first feed line 111 and the second feed line 112 can be effectively reduced, thereby improving the performance of the antenna. A length of the first isolation component 113 is in a range from $0.2\lambda c$ to $0.25\ \lambda c$, where $\lambda c$ is a wavelength at a center frequency. For example: the length of the first isolation component 113 is $0.25\ \lambda c$. The best decoupling effect between the feed ports of the first feed line 111 and the second feed line 112 is achieved by reasonably setting the length of the first isolation component 113.

Further, at least one side wiring 30 is formed on a side of the first dielectric substrate 13 close to the flexible circuit board, and each isolation component is connected to the second conductive layer 12 through a corresponding side wiring 30, so that the second conductive layer 12 is electrically connected to the third connection pads 214. That is, ground signals are loaded onto the second conductive layer 12, the third conductive layer 25 and the first isolation components 113 through the third connection pads 214.

In some examples, the at least one first opening 121 includes a plurality of first openings 121. That is, the at least one radiation unit 100 includes a plurality of radiation units 100, and the plurality of first openings 121 are arranged side by side along a first direction X; the second conductive layer 12 includes a first side edge and a second side edge that are oppositely disposed in a second direction Y; the flexible circuit board 20 is closer to the first side edge than the second side edge; the second conductive layer 12 further includes second openings 122 penetrating through the first side edge, and at least one second opening 122 is disposed between any two adjacent first openings 121, and an extending direction of the second opening 122 intersects with the first direction X. In the embodiment of the present disclosure, the coupling of the microwave signal between the radiation units 100 is reduced by disposing the at least one second opening 122 in the first conductive layer 11 between the first openings 121 of the any two adjacent radiation units 100. In some examples, each second opening 122 has a length in a range from $0.2\lambda c$ to $0.25\ \lambda c$, where $\lambda c$ is the wavelength at the center frequency. For example: the length of the second opening 122 is $0.25\ \lambda c$. The best decoupling effect between the any two adjacent radiation units 100 is achieved by reasonably setting the length of the second opening 122. In some examples, one or more second openings 122 may be provided between the any two adjacent first openings 121. FIG. 5 exemplarily illustrates that three second openings 122 are provided between the adjacent first openings 121. In the embodiment of the present disclosure, the number of the second openings 122 and a distance between adjacent second openings 122 are designed to change a current path between the radiation units 100, so that an orthogonally distributed current is formed between the radiation units 100, thereby reducing the coupling between the radiation units 100.

Further, the second conductive layer 12 further includes third openings 123 penetrating through the second side edge, at least one third opening 123 is disposed between the any two adjacent first openings 121, and an extending direction of each third opening 123 intersects with the first direction X; each second opening 122 and a corresponding third opening 123 are arranged in mirror symmetry with respect to a line connecting centers of the first openings 121 as a symmetry axis. In this way, the uniformity of the light transmittance of the antenna substrate 10 is ensured.

In some examples, with continued reference to FIG. 4, a shape of an outline of each first opening 121 in the second conductive layer 12 in embodiments of the present disclosure includes, but is not limited to, a triangle, a quadrilateral, an octagon, a cross, a circle or an ellipse, or the like. In the embodiment of the present disclosure, the polygonal first openings 121 are disposed in the second conductive layer 12 to change an impedance distribution of a surface of a radiation slit of the second conductive layer 12 and a current path on the second conductive layer 12, thereby expanding a bandwidth and matching the impedance.

For example: in the embodiment of the present disclosure, as an example, the outline of each first opening 121 is a polygon, such as an octagon. The outline of each first opening 121 specifically includes a first side, a second side, a third side, a fourth side, a fifth side, a sixth side, a seventh side, and an eighth side connected in sequence; an extending direction of the first side is the same as that of the fifth side, and is perpendicular to that of the third side; an orthographic projection of a corresponding first feed line 111 on the first dielectric substrate 13 intersect with an orthographic projection of the second side on the first dielectric substrate 13 and an orthographic projection of a corresponding second feed line 112 on the first dielectric substrate 13 intersect with an orthographic projection of the eighth side on the first dielectric substrate 13. In this case, the antenna of the embodiment of the present disclosure can realize a polarization direction of ±45°.

Figure 10:
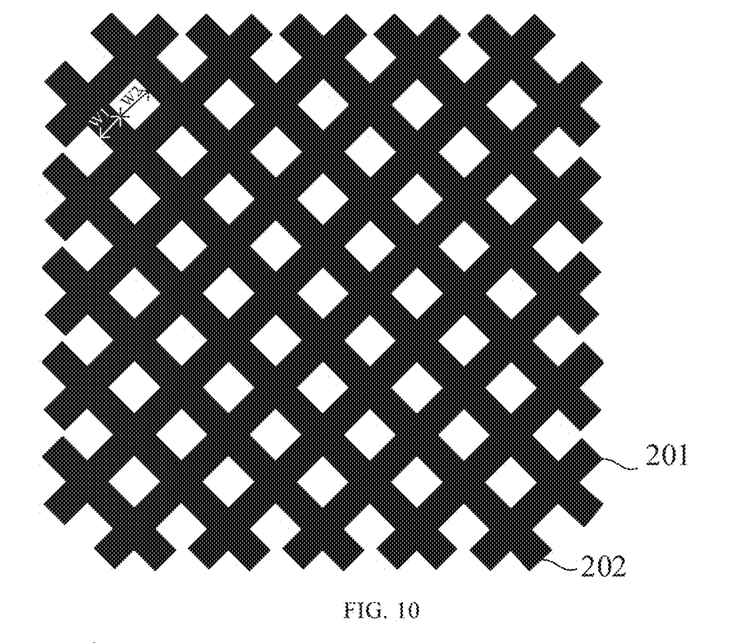
FIG. 10 is a schematic diagram of a structure of a metal mesh according to an embodiment of the present disclosure.

In some examples, FIG. 10 is a schematic diagram of a structure of a metal mesh according to an embodiment of the present disclosure. As shown in FIG. 10, the second conductive layer 12 includes a metal mesh structure. The metal mesh structure may include a plurality of first metal lines 201 and a plurality of second metal lines 202 crossing with the plurality of first metal lines 201. For example: extending directions of each first metal line 201 and each second metal line 202 may be perpendicular to each other, thereby forming a square or a rectangular hollow portion. Alternatively, the extending directions of each first metal line 201 and each second metal line 202 of the metal mesh may be not perpendicular to each other. For example: an included angle between the extending directions of each first metal line 201 and each second metal line 202 is 45°, thereby forming a diamond-shaped hollow portion. In some examples, line widths, line thicknesses, and line spacing of each first metal line 201 and each second metal line 202 of the metal mesh structure are preferably equal to each other, but may be different from each other. For example: each of the first metal lines 201 and the second metal lines 202 has a line width W1 in a range from about 1 μm to 30 μm, a line spacing W2 in a range from about 50 μm to 250 μm and a line thickness in a range from about 0.5 μm to 10 μm. The metal mesh structure in the embodiments of the present disclosure may be formed on the first dielectric substrate 13 through processes including, but not limited to, imprinting or etching.

In some examples, when the second conductive layer 12 adopts the metal mesh structure, ends of the first metal lines 201 and the second metal lines 202, which are close to the flexible circuit board, of the metal mesh structure of the second conductive layer 12 may be connected together. For example: with continued reference to FIG. 4, the antenna substrate 10 further includes a plurality of first connection strips 40 disposed in the same layer as the second conductive layer 12, wherein the plurality of first connection strips 40 short connects an edge of the metal mesh structure close to the flexible circuit board 20. The first connection strips 40 may be made of copper, and specifically, may be made of bendable copper. In this way, the metal lines of the metal mesh structure are prevented from being broken when the flexible circuit board 20 is bound to the antenna substrate 10 and then the flexible circuit board 20 is turned over. The electrical stability of the metal mesh structure is ensured through the connection of the first connection strips 40. Alternatively, in an actual product, the ends of the first metal lines 201 and the second metal lines 202 of the metal mesh structure may not be connected to each other. That is, the periphery of the metal mesh structure is radial.

Further, the first conductive layer 11 of the embodiment of the present disclosure may also adopt a metal mesh structure, that is, the first feed lines 111, the second feed lines 112 and the first isolation components 113 may all adopt a metal mesh structure. When the first conductive layer 11 and the second conductive layer 12 both adopt the metal mesh structure, projections of the hollow portions of the metal mesh structures of the first conductive layer 11 and the second conductive layer 12 on the first dielectric substrate 13 completely or substantially overlap with each other. It should be noted that the substantially overlapping in the embodiment of the present disclosure means that a width of the overlapping area of the orthographic projections of the hollow portions of the metal mesh structures of the two layers is not greater than 1 time of the line width. In this way, the optical transmittance of the antenna can be effectively improved. In the embodiment of the present disclosure, the light transmittance of the metal mesh structure of each layer is in a range from about 70% to 88%.

Figure 11:
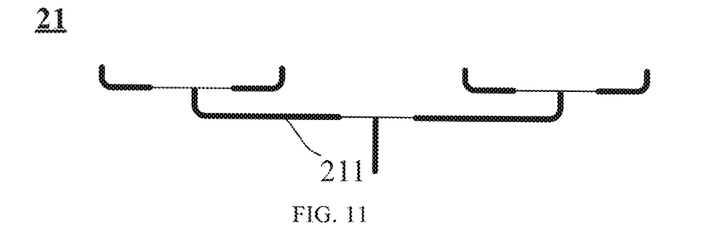
FIG. 11 is a schematic diagram of a first feed structure according to an embodiment of the present disclosure.

In some examples, FIG. 11 is a schematic diagram of a first feed structure 21 according to an embodiment of the present disclosure. As shown in FIG. 11, in an embodiment of the present disclosure, when the number of the first openings 121 in the second conductive layer 12 is $2^n$, the first feed structure 21 includes n stages of third feed lines 211, and the second feed structure 22 includes n stages of fourth feed lines 221. At least one of the third feed lines 211 and the fourth feed lines 221 is a micro-strip line. In the embodiment of the present disclosure, both the third feed lines 211 and the fourth feed lines 221 are micro-strip lines. One third feed line 211 located at the 1st stage is connected to two adjacent first feed lines 111, and a different third feed line 211 located at the 1st stage is connected to different two adjacent first feed lines 111. One third feed line 211 located at the m-th stage is connected to two adjacent third feed lines 211 located at the (m−1)-th stage, and a different third feed line 211 located at the m-th stage is connected to different two adjacent third feed lines 211 located at the (m−1)-th stage. One fourth feed line 221 located at the 1st stage is connected to two adjacent second feed lines 112, and a different fourth feed line 221 located at the 1st stage is connected to different two adjacent second feed lines 112. One fourth feed line 221 located at the m-th stage is connected to two adjacent fourth feed lines 221 located at the (m−1)-th stage, and a different fourth feed line 221 located at the m-th stage is connected to different two adjacent fourth feed lines 221 located at the (m−1)-th stage; where n≥2, 2≤m≤n; and both m and n are integers.

It should be noted that each of the third feed lines 211 and the fourth feed lines 221 has two feed ports; a feed port of the third feed line 211 located at the 1st stage serves as a second feed port of the first feed structure 21; a feed port of the fourth feed line 221 located at the 1st stage serves as the fourth feed port of the second feed structure 22; the first feed port of the first feed structure 21 is connected to the third feed line 211 located at the n-th stage; the third feed port of the second feed structure 22 is connected to the fourth feed line 221 located at the n-th stage.

For example: the second conductive layer 12 of the antenna in FIG. 1 includes 4 first openings 121. i.e. n=2, and the first feed structure 21 adopts one-to-two and two-to-four two-stage third feed lines 211 (including 3 third feed lines 211 in total); the second feed structure 22 adopts one-to-two and two-to-four two-stage fourth feed lines 221 (including 3 fourth feed lines 221 in total). One third feed line 211 located at the 1st stage is connected to feed ports of the 1st and 2nd first feed lines 111 in a direction from left to right, and the other third feed line 211 is connected to feed ports of the 3rd and 4th first feed lines 111 in the direction from left to right; the third feed line 211 at the 2nd stage is connected to feed ports of the two third feed lines 211 at the 1st stage. Similarly, one fourth feed line 221 located at the 1st stage is connected to feed ports of the 1st and 2nd second feed lines 112 in the direction from left to right, and the other fourth feed line 221 is connected to feed ports of the 3rd and 4th second feed lines 112 in the direction from left to right; the fourth feed line 221 at the 2nd stage is connected to feed ports of the two fourth feed lines 221 at the 1st stage.

In some examples, in addition to the above structure, the antenna further includes a first connector and a second connector; the first connector is electrically connected to the first feed port of the first feed structure 21; the second connector is electrically connected to the third feed port of the second feed structure 22. In one example, the first and second connectors include, but are not limited to, Small A Type (SMA) connectors.

Figure 9:
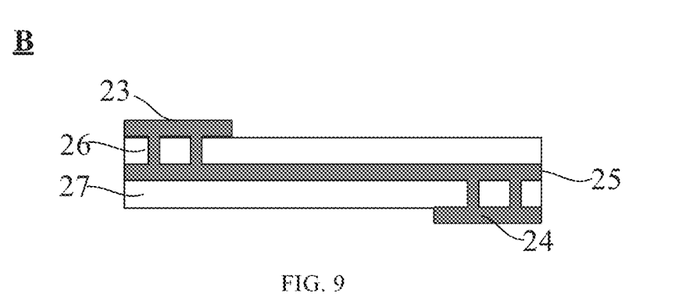
FIG. 9 is a cross-sectional view at a position B in FIG. 7.

Further, FIG. 9 is a cross-sectional view at a position B in FIG. 7. Referring to FIGS. 7 and 9, the fourth conductive layer 210 further includes a first patch electrode 23 located on two sides of the first feed port of the first feed structure 21 in an extending direction of the first feed port; the first patch electrode 23 is electrically connected to the third conductive layer 25 through third connection vias penetrating through the second dielectric substrate 26; the fifth conductive layer 220 further includes a second patch electrode 24 located on two sides of the third feed port of the first feed structure 21 in an extending direction of the third feed port; the second patch electrode 24 is electrically connected to the third conductive layer 25 through fourth connection vias penetrating through the third dielectric substrate 27. The first patch electrode 23 and the second patch electrode 24 are provided so that the first feed port may be connected to the first connector and the third feed port may be connected to the second connector.

Figure 12:
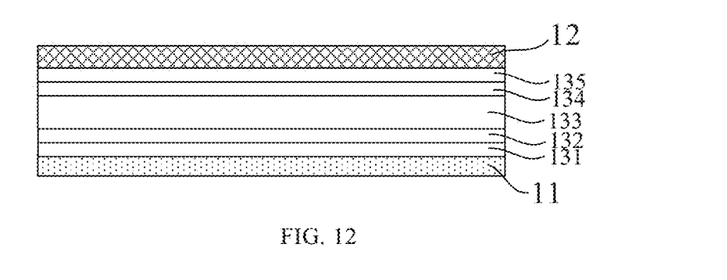
FIG. 12 is a cross-sectional view of a structure of a first dielectric substrate according to an embodiment of the present disclosure.

In some examples, FIG. 12 is a cross-sectional view of a structure of a first dielectric substrate 13 according to an embodiment of the present disclosure. As shown in FIG. 12, in the embodiment of the present disclosure, the first dielectric substrate 13 includes a first dielectric sub-layer 131, a first adhesive layer 132, a support layer 133, a second adhesive layer 134, and a second dielectric sub-layer 135, which are stacked. The first conductive layer 11 is disposed on a surface of the first dielectric sub-layer 131 away from the first adhesive layer 132. The second conductive layer 12 is disposed on a surface of the second dielectric sub-layer 135 away from the second adhesive layer 134. In some examples, a material of each of the first dielectric sub-layer 131 and the second dielectric sub-layer 135 includes, but is not limited to, polyimide (PI) or polyethylene terephthalate (PET). A material of each of the first adhesive layer 132 and the second adhesive layer 134 may be optical clear adhesive (OCA). A material of the support layer 133 includes, but is not limited to, polycarbonate (PC), copolymers of cycloolefin (COP), polymethyl methacrylate (PMMA), or the like.

In some examples, the second dielectric substrate 26 and the third dielectric substrate 27 are both made of flexible base materials, specifically including, but not limited to, polyimide (PI) or polyethylene terephthalate (PET).

In order to clearly understand the structure and effect of the transparent antenna of the embodiment of the present disclosure, an effect diagram obtained through a simulation for the antenna is described below with reference to the antenna structure shown in FIG. 1.

Referring to FIG. 1, the antenna includes the antenna substrate 10 and the flexible circuit board 20. The antenna substrate 10 includes 4 radiation units 100. The antenna has a size of 301 mm×76 mm×2.2 mm (2.207 $\lambda c$×0.557 $\lambda c$×0.016 $\lambda c$, $\lambda c$ is the wavelength at the center frequency). A distance between any two adjacent radiation units 100 is 75 mm (0.55$\lambda c$).

Specifically, the antenna substrate 10 includes the first dielectric substrate 13, and the first conductive layer 11 and the second conductive layer 12 respectively disposed on two sides of the first dielectric substrate 13 in a thickness direction of the first dielectric substrate 13. Each radiation structure includes one first feed line 111, one second feed line 112, one first isolation component 113 in the first conductive layer 11, and one first opening 121 in the second conductive layer 12. The second conductive layer 12 further includes at least one second opening 122 and at least one third opening 123 between any two adjacent first openings 121. The flexible circuit board 20 includes the second dielectric substrate 26 and the third dielectric substrate 27, which are oppositely disposed, and the third conductive layer 25, the fourth conductive layer 210, and the fifth conductive layer 220. The third conductive layer 25 is disposed between the second dielectric substrate 26 and the third dielectric substrate 27; the fourth conductive layer 210 is disposed on a side of the second dielectric substrate 26 away from the third conductive layer 25, and the fifth conductive layer 220 is disposed on a side of the third dielectric substrate 27 away from the third conductive layer 25. The fourth conductive layer 210 includes at least the first feed structure 21, the first connection pads 212, the second connection pads 213 and the third connection pads 214. The first feed structure 21 has one first feed port and at least one second feed port. The fifth conductive layer 220 includes at least the second feed structure 22, and the second feed structure 22 has one third feed port and at least one fourth feed port. The second feed ports of the first feed structure in the fourth conductive layer 210 are connected to the first connection pads 212 in a one-to-one correspondence; the fourth feed ports of the second feed structure 22 in the fifth conductive layer 220 are connected to the second connection pads 213 in a one-to-one correspondence through second connection vias penetrating through the second dielectric substrate 26 and the third dielectric substrate 27; the third conductive layer 25 is electrically connected to the third connection pads 214 through first connection vias penetrating through the second dielectric substrate 26; the first isolation components 113 are electrically connected to the third connection pads 214, and electrically connected to the second conductive layer 12 through the side wirings 30. In the embodiment of the present disclosure, the first feed lines 111 on the antenna substrate 10 are in a one-to-one correspondence with the first connection pads 212; and a first feed line 111 and a first connection pad 212 corresponding to the first feed line 111 are bound to each other; the second feed lines 112 are in a one-to-one correspondence with the second connection pads 213; and a second feed line 112 and a second connection pad 213 corresponding to the second feed line 112 are bound to each other.

Figure 13:
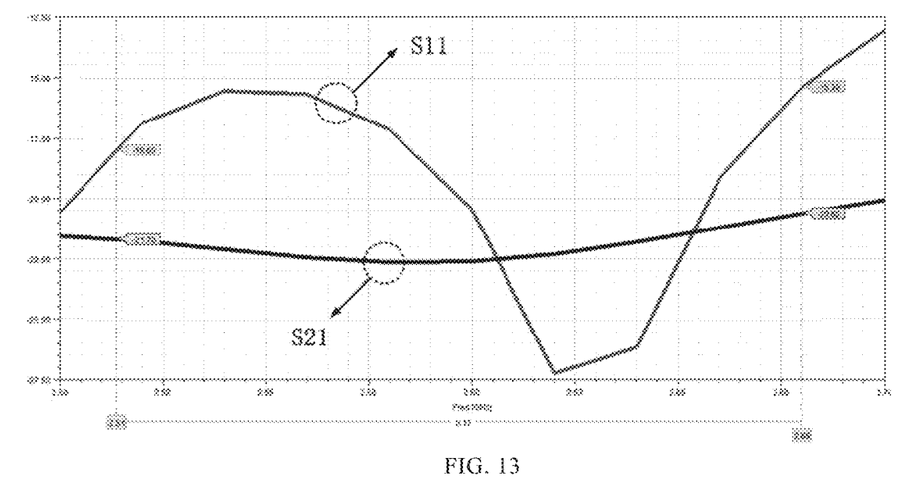
FIG. 13 is a schematic diagram illustrating S parameters of an antenna according to an embodiment of the present disclosure.

FIG. 13 is a schematic diagram of S parameters of an antenna according to an embodiment of the present disclosure. As shown in FIG. 13. FIG. 13 respectively shows the return loss S11 and the isolation S21 between ports of the antenna according to the embodiment of the present disclosure. The antenna according to the embodiment of the present disclosure can cover a frequency band in a range from 2515 MHz to 2675 MHZ under the standard that the return loss is less than −15 dB. The isolation between ports in the frequency band is better than −20.6 dB.

Figure 14:
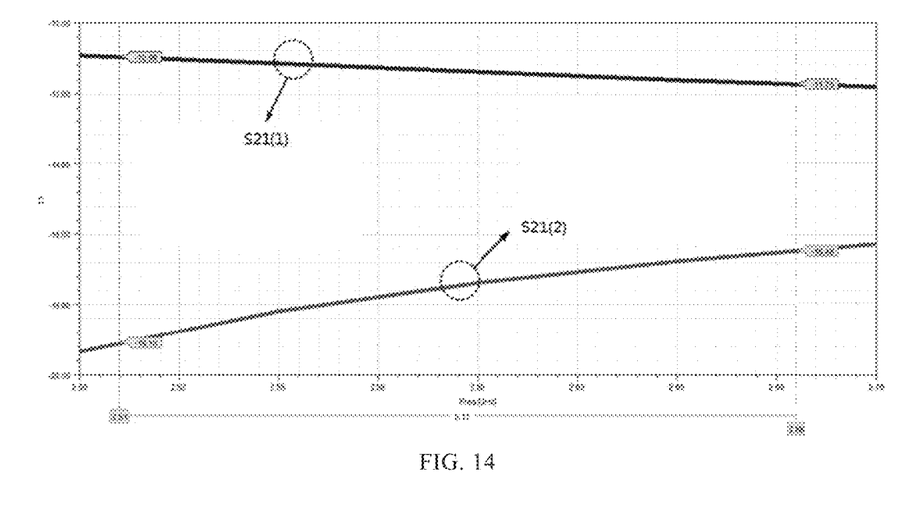
FIG. 14 is a schematic diagram illustrating isolation difference between antennas with and without a first isolation component according to an embodiment of the present disclosure.

FIG. 14 is a schematic diagram illustrating a variation in isolation of an antenna with and without a first isolation component according to an embodiment of the present disclosure. As shown in FIG. 14, in the antenna of the embodiment of the present disclosure, without the first isolation components 113, as shown in S21(1) in FIG. 14, the isolation between a port for 45° polarization and a port for −45° polarization of the radiation unit 100 in the frequency band is better than −10.9 dB. In the antenna of the embodiment of the present disclosure, with the first isolation components 113, as shown in S21(2) in FIG. 14, the isolation between the ports for ±45° polarization of the radiation unit 100 in the frequency band is better than −16.4 dB, which is improved by more than 5 dB, and the isolation at a low frequency reaches −19 dB.

Figure 15:
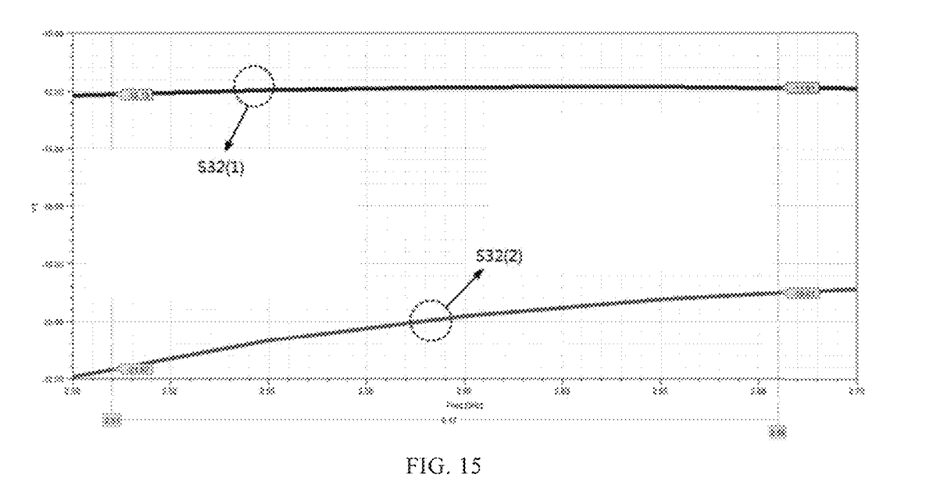
FIG. 15 is a schematic diagram illustrating isolation difference between antennas with and without second openings and third openings according to an embodiment of the present disclosure.

FIG. 15 is a schematic diagram illustrating a variation in isolation of an antenna with and without second openings and third openings according to the embodiment of the present disclosure. As shown in FIG. 15, in the antenna of the embodiment of the present disclosure, without the second openings 122 and the third openings 123, as shown in S32(1) in FIG. 15, the isolation between the ports for ±45° polarization of the radiation unit 100 in the frequency band is better than −11.9 dB. In the antenna of the embodiment of the present disclosure, with the second openings 122 and the third openings 123, as shown in S32(2) in FIG. 15, the isolation between the ports for ±45° polarization of the radiation unit 100 in the frequency band is better than −19 dB, which is improved by more than 7 dB, and the isolation at a low frequency reaches −21.6 dB.

Figure 16:
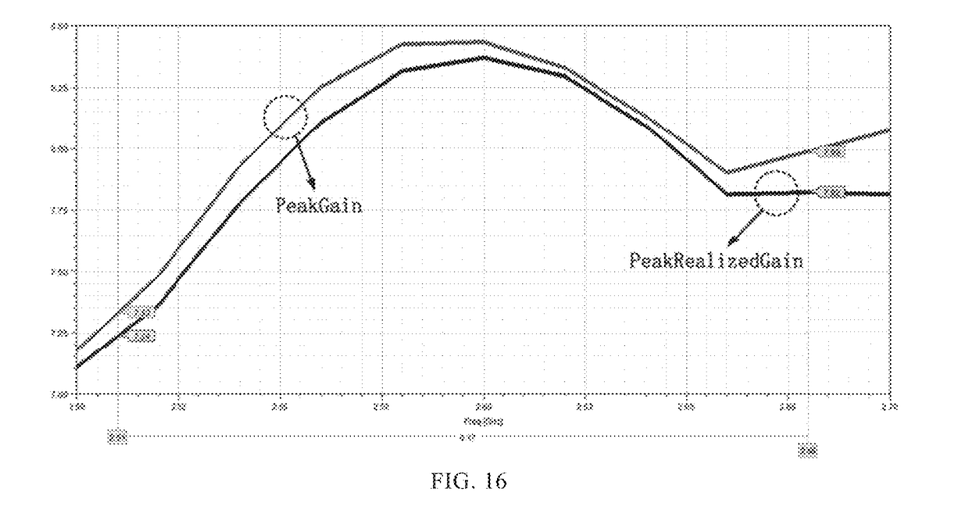
FIG. 16 is a schematic diagram illustrating a peak gain varying with frequency of an antenna according to an embodiment of the present disclosure.

FIG. 16 is a schematic diagram illustrating a variation in a peak gain of an antenna with a frequency according to an embodiment of the present disclosure. As shown in FIG. 16, the peak gain is greater than 7.2 dBi in an operating frequency band of 2515 MHz to 2675 MHz, and thus, signals in a large communication range can be radiated by the antenna.

Figure 17:
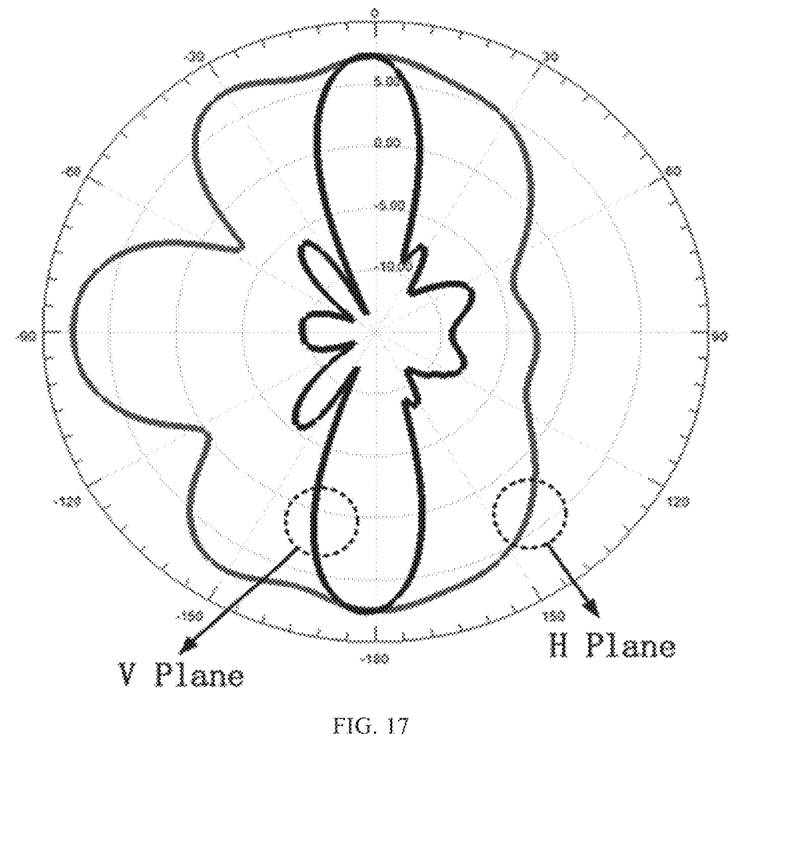
FIG. 17 is a radiation pattern of an antenna at a center frequency according to an embodiment of the present disclosure.

FIG. 17 is a radiation pattern of an antenna at a center frequency according to an embodiment of the present disclosure. As shown in FIG. 17, the V plane radiation pattern has a narrow half power beam width because a quaternary antenna array is formed in this direction. The H plane has a wide half power beam width, and a power divider is provided to expand the equivalent ground plane of the H plane of the antenna, so that a larger side lobe appears on the H plane.

In a second aspect, the embodiment of the present disclosure provides an electronic device that may include the above antenna, which may be fixed inside a glass window.

A glass window system in the embodiment of the present disclosure may be used in a glass window system for an automobile, a train (including a high-speed rail), an aircraft, a building, or the like. The antenna may be fixed inside of the glass window (a side closer to a room). Because the optical transmittance of the antenna is high, the transmittance of the glass window is not greatly affected while realizing the communication function of the antenna, and such the antenna becomes a development trend for an aesthetic antenna. The glass window in the embodiments of the present disclosure includes, but is not limited to, double glass, single glass, laminated glass, thin glass, thick glass, or the like.

In some examples, the electronic device provided by embodiments of the present disclosure further includes a transceiver unit, a radio frequency transceiver, a signal amplifier, a power amplifier, and a filtering unit. The antenna in the electronic device may be used as a transmitting antenna or a receiving antenna. The transceiver unit may include a baseband and a receiving terminal, where the baseband provides a signal in at least one frequency band, such as 2G signal, 3G signal, 4G signal, 5G signal, or the like; and transmits the signal in the at least one frequency band to the radio frequency transceiver. After the signal is received by a transparent antenna in a communication system and is processed by the filtering unit, the power amplifier, the signal amplifier, and the radio frequency transceiver (not shown in the drawings), the transparent antenna may transmit the signal to the receiving terminal (such as an intelligent gateway or the like) in the transceiver unit.

Further, the radio frequency transceiver is connected to the transceiver unit and is configured to modulate the signals transmitted by the transceiver unit or demodulate the signals received by the transparent antenna and then transmit the signals to the transceiver unit. Specifically, the radio frequency transceiver may include a transmitting circuit, a receiving circuit, a modulating circuit, and a demodulating circuit. After the transmitting circuit receives multiple types of signals provided by the baseband, the modulating circuit may modulate the multiple types of signals provided by the baseband, and then transmit the modulated signals to the antenna. The signals received by the transparent antenna are transmitted to the receiving circuit of the radio frequency transceiver, and transmitted by the receiving circuit to the demodulating circuit, and demodulated by the demodulating circuit and then transmitted to the receiving terminal.

Further, the radio frequency transceiver is connected to the signal amplifier and the power amplifier, which are in turn connected to the filtering unit connected to at least one antenna. In the process of transmitting signals by the communication system, the signal amplifier is used for improving a signal-to-noise ratio of the signals output by the radio frequency transceiver and then transmitting the signals to the filtering unit; the power amplifier is used for amplifying the power of the signals output by the radio frequency transceiver and then transmitting the signals to the filtering unit; the filtering unit specifically includes a duplexer and a filtering circuit, the filtering unit combines signals output by the signal amplifier and the power amplifier and filters noise waves and then transmits the signals to the transparent antenna, and the antenna radiates the signals. In the process of receiving signals by the communication system, the signals received by the antenna are transmitted to the filtering unit, which filters noise waves in the signals received by the antenna and then transmits the signals to the signal amplifier and the power amplifier, and the signal amplifier gains the signals received by the antenna to increase the signal-to-noise ratio of the signals; the power amplifier amplifies the power of the signals received by the antenna. The signals received by the antenna are processed by the power amplifier and the signal amplifier and then transmitted to the radio frequency transceiver, and the radio frequency transceiver transmits the signals to the transceiver unit.

In some examples, the signal amplifier may include various types of signal amplifiers, such as a low noise amplifier, without limitation.

In some examples, the electronic device provided by the embodiments of the present disclosure further includes a power management unit connected to the power amplifier and for providing the power amplifier with a voltage for amplifying the signal.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. An antenna, comprising an antenna substrate and a flexible circuit board; wherein
    the antenna substrate comprises:
    a first dielectric substrate;
    a first conductive layer on the first dielectric substrate and comprising at least one first feed line and at least one second feed line; and
    a second conductive layer on a side of the first dielectric substrate away from the first conductive layer and comprising at least one first opening;
    wherein an orthographic projection of one of the at least one first opening on the first dielectric substrate intersects with an orthographic projection of one of the at least one first feed line on the first dielectric substrate and an orthographic projection of one of the at least one second feed line on the first dielectric substrate;
    the orthographic projection of the first feed line on the first dielectric substrate and the orthographic projection of the second feed line on the first dielectric substrate extends into the orthographic projection of the first opening on the first dielectric substrate; and
    the first feed line and the second feed line have different feed directions; and
    the flexible circuit board comprises:
    a second dielectric substrate and a third dielectric substrate opposite to each other;
    a third conductive layer between the second dielectric substrate and the third dielectric substrate;
    a first feed structure on a side of the second dielectric substrate away from the third conductive layer; wherein the first feed structure comprises at least one second feed port, and each second feed port of the first feed structure is electrically connected to a corresponding first feed line;
    a second feed structure on a side of the third dielectric substrate away from the third conductive layer; wherein the second feed structure comprises at least one fourth feed port, and each fourth feed port of the second feed structure is electrically connected to a corresponding second feed line;
    a fourth conductive layer on a side of the second dielectric substrate away from the third conductive layer and comprising the first feed structure, at least one first connection pad, at least one second connection pad, and at least one third connection pad; wherein the second feed port of the first feed structure is electrically connected to a corresponding first connection pad, and each first feed line is bound to a corresponding first connection pad; the third conductive layer is electrically connected to the second connection pad through a first connection via penetrating through the second dielectric substrate; and
    a fifth conductive layer on a side of the third dielectric substrate away from the third conductive layer and comprising the second feed structure; wherein the fourth feed port of the second feed structure is electrically connected to a corresponding second connection pad through a corresponding second connection via penetrating through the second dielectric substrate and the third dielectric substrate, and each second feed line is bound to a corresponding second connection pad.

2. The antenna of claim 1, wherein the antenna substrate comprises at least one radiation unit, each of which comprises one first opening, and one first feed line and one second feed line, orthographic projections of which on the first dielectric substrate intersect with the orthographic projection of the first opening on the first dielectric substrate, respectively;
    the radiation unit further comprises a first isolation component in the first conductive layer, and between the first feed line and the second feed line and bound to the third connection pad; and
    in the radiation unit, an orthographic projection of the first isolation component on the first dielectric substrate intersects with the orthographic projection of the first opening on the first dielectric substrate and extends into the orthographic projection of the first opening on the first dielectric substrate.

3. The antenna of claim 2, further comprising at least one side wiring is disposed on a side of the first dielectric substrate; wherein each first isolation component is electrically connected to the second conductive layer through a corresponding side wiring.

4. The antenna of claim 1, wherein the at least one first opening comprises a plurality of first openings arranged side by side along a first direction; the second conductive layer comprises a first side edge and a second side edge opposite to each other in a second direction; and the flexible circuit board is closer to the first side edge than the second side edge; and
    the second conductive layer further comprises second openings penetrating through the first side edge, at least one second opening is disposed between any two adjacent first openings, and an extending direction of each second opening intersects with the first direction.

5. The antenna of claim 4, wherein each second opening extends in the second direction and has a length in a range from $0.2\lambda c$ to $0.25 \lambda c$, where $\lambda c$ is a wavelength at a center frequency of an operating frequency band of the antenna.

6. The antenna of claim 4, wherein the second conductive layer further comprises third openings penetrating through the second side edge, and at least one third opening is disposed between any two adjacent first openings, and an extending direction of each third opening intersects with the first direction; and each second opening and a corresponding third opening are in mirror symmetry with respect to a line connecting centers of the plurality of first openings as a symmetry axis.

7. The antenna of claim 1, wherein the second conductive layer comprises a metal mesh structure.

8. The antenna of claim 7, wherein the antenna substrate further comprises a plurality of first connection strips in a same layer as the second conductive layer; and edges of the metal mesh structure close to the flexible circuit board are shorted by the plurality of first connection strips.

9. The antenna of claim 1, wherein each first opening comprises a polygon.

10. The antenna of claim 9, wherein the polygon comprises a first side, a second side, a third side, a fourth side, a fifth side, a sixth side, a seventh side, and an eighth side connected in sequence;
an extending direction of the first side is the same as that of the fifth side, and is perpendicular to that of the third side; and
an orthographic projection of a corresponding first feed line on the first dielectric substrate intersects with an orthographic projection of the second side on the first dielectric substrate and an orthographic projection of a corresponding second feed line on the first dielectric substrate intersects with an orthographic projection of the eighth side on the first dielectric substrate.

11. An antenna, comprising an antenna substrate and a flexible circuit board; wherein
the antenna substrate comprises:
a first dielectric substrate;
a first conductive layer on the first dielectric substrate and comprising at least one first feed line and at least one second feed line; and
a second conductive layer on a side of the first dielectric substrate away from the first conductive layer and comprising at least one first opening;
wherein an orthographic projection of one of the at least one first opening on the first dielectric substrate intersects with an orthographic projection of one of the at least one first feed line on the first dielectric substrate and an orthographic projection of one of the at least one second feed line on the first dielectric substrate;
the orthographic projection of the first feed line on the first dielectric substrate and the orthographic projection of the second feed line on the first dielectric substrate extends into the orthographic projection of the first opening on the first dielectric substrate; and
the first feed line and the second feed line have different feed directions; and
the flexible circuit board comprises:
a second dielectric substrate and a third dielectric substrate opposite to each other;
a third conductive layer between the second dielectric substrate and the third dielectric substrate;
a first feed structure on a side of the second dielectric substrate away from the third conductive layer; wherein the first feed structure comprises at least one second feed port, and each second feed port of the first feed structure is electrically connected to a corresponding first feed line; and
a second feed structure on a side of the third dielectric substrate away from the third conductive layer; wherein the second feed structure comprises at least one fourth feed port, and each fourth feed port of the second feed structure is electrically connected to a corresponding second feed line;

wherein the at least one first opening comprises $2^n$ first openings; the first feed structure comprises n stages of third feed lines, and the second feed structure comprises n stages of fourth feed lines;
one third feed line at the 1st stage is connected to two adjacent first feed lines, and different third feed lines at the 1st stage are connected to different two adjacent first feed lines; and one third feed line at the m-th stage is connected to two adjacent third feed lines at the (m−1)-th stage;
one fourth feed line at the 1st stage is connected to two adjacent second feed lines, and different fourth feed lines at the 1st stage are connected to different two adjacent second feed lines; and one fourth feed line at the m-th stage is connected to two adjacent fourth feed lines at the (m−1)-th stage; where $n \geq 2$, $2 \leq m \leq n$; and both m and n are integers;
at least one of the third feed line and the fourth feed line is a micro-strip line;
wherein each of the third feed lines and the fourth feed lines has two feed ports at the 1st stage;
a feed port of the third feed line at the 1st stage is the second feed port of the first feed structure; a feed port of the fourth feed line at the 1st stage is the fourth feed port of the second feed structure;
a first feed port of the first feed structure is connected to the third feed line at the n-th stage; a third feed port of the second feed structure is connected to the fourth feed line at the n-th stage; and
the antenna further comprises a first connector and a second connector; the first connector is electrically connected to the first feed port of the first feed structure; and the second connector is electrically connected to the third feed port of the second feed structure.

12. The antenna of claim 11, wherein the fourth conductive layer further comprises a first patch electrode on two sides of the first feed port, in an extending direction of the first feed port, of the first feed structure;
the first patch electrode is electrically connected to the third conductive layer through a third connection via penetrating through the second dielectric substrate;
the fifth conductive layer further comprises a second patch electrode on two sides of the third feed port, in an extending direction of the third feed port, of the first feed structure; and
the second patch electrode is electrically connected to the third conductive layer through a fourth connection via penetrating through the third dielectric substrate.

13. The antenna of claim 1, wherein the first dielectric substrate comprises a first dielectric sub-layer, a first adhesive layer, a support layer, a second adhesive layer, a second dielectric sub-layer, which are stacked together;
the first conductive layer is on a side of the first dielectric sub-layer away from the first adhesive layer; and
the second conductive layer is on a surface of the second dielectric sub-layer away from the second adhesive layer.

14. The antenna of claim 13, wherein a material of the support layer comprises any one of polycarbonate, copolymers of cycloolefin, or polymethyl methacrylate.

15. The antenna of claim 13, wherein a material of the first dielectric sub-layer and/or the second dielectric sub-layer comprises polyimide or polyethylene terephthalate.

16. An electronic device, comprising the antenna of claim 1.

17. The antenna of claim 2, wherein the first isolation component has a length in a range from $0.2\lambda c$ to $0.25 \lambda c$, where $\lambda c$ is a wavelength at a center frequency of an operating frequency band of the antenna.

18. The antenna of claim 11, wherein different third feed lines at the m-th stage are connected to different two adjacent third feed lines at the (m−1)-th stage;

different fourth feed lines at the m-th stage are connected to different two adjacent fourth feed lines at the (m−1)-th stage;

where $2 \leq m \leq n$.

* * * * *